(12) United States Patent
Feng et al.

(10) Patent No.: US 11,869,807 B2
(45) Date of Patent: Jan. 9, 2024

(54) FULLY SELF-ALIGNED SUBTRACTIVE ETCH

(71) Applicant: Applied Materials, Inc., Santa Clara, CA (US)

(72) Inventors: Lili Feng, San Jose, CA (US); Yuqiong Dai, Santa Clara, CA (US); Madhur Sachan, Belmont, CA (US); Regina Freed, Los Altos, CA (US); Ho-yung David Hwang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 267 days.

(21) Appl. No.: 17/335,399

(22) Filed: Jun. 1, 2021

(65) Prior Publication Data

US 2021/0391215 A1 Dec. 16, 2021

Related U.S. Application Data

(60) Provisional application No. 63/037,210, filed on Jun. 10, 2020.

(51) Int. Cl.
*H01L 21/768* (2006.01)
*H01L 23/522* (2006.01)

(52) U.S. Cl.
CPC .. *H01L 21/76885* (2013.01); *H01L 21/76832* (2013.01); *H01L 21/76837* (2013.01); *H01L 23/5226* (2013.01)

(58) Field of Classification Search
CPC ......... H01L 21/76885; H01L 21/76832; H01L 21/76837; H01L 23/5226; H01L 23/53242;

(Continued)

(56) References Cited

U.S. PATENT DOCUMENTS 8,198,188 B1 6/2012 Pierrat
2016/0372369 A1* 12/2016 Shaviv ............... H01L 23/5329

(Continued)

FOREIGN PATENT DOCUMENTS

KR 20160098183 A 8/2016

OTHER PUBLICATIONS

Wan, Danny, et al., "Subtractive Etch of Ruthenium for Sub-5nm Interconnect", pp. 10-12 IEEE (2018).

(Continued)

*Primary Examiner* — Karen Kusumakar
(74) *Attorney, Agent, or Firm* — Servilla Whitney LLC

(57) ABSTRACT

Apparatuses and methods to provide fully self-aligned first metallization lines, M1, via, and second metallization lines, M2, are described. A first metallization line comprises a set of first conductive lines extending along a first direction on a first insulating layer on a substrate; a second metallization line comprising a set of second conductive lines on an etch stop layer above the first metallization line, the set of second conductive lines extending along a second direction that crosses the first direction at an angle; and at least one via between the first metallization line and the second metallization line, the at least one via comprising a via metallization layer, wherein the at least one via is self-aligned along the second direction to one of the first metallization lines and the at least one via is self-aligned along the first direction to one of the second metallization lines, the second direction crossing the first direction at an angle.

14 Claims, 8 Drawing Sheets

(58) Field of Classification Search
CPC ......... H01L 21/76897; H01L 21/32139; H01L 21/0337; H01L 21/76829; H01L 23/528; H01L 23/53209; H01L 23/5329
See application file for complete search history.

(56) References Cited

U.S. PATENT DOCUMENTS

| | | |
|---|---|---|
| 2017/0372960 A1 | 12/2017 | Mebarki et al. |
| 2018/0102317 A1 | 4/2018 | Edelstein et al. |
| 2019/0043754 A1 | 2/2019 | Brink et al. |
| 2019/0206733 A1* | 7/2019 | Lin .................. H01L 21/76832 |
| 2020/0066629 A1* | 2/2020 | Schenker .......... H01L 23/53238 |
| 2021/0313264 A1* | 10/2021 | Park .................... H01L 23/5329 |
| 2022/0262791 A1* | 8/2022 | Shi ........................ H01L 29/785 |

OTHER PUBLICATIONS

"PCT International Search Report and Written Opinion in PCT/US2021/035336 dated Sep. 23, 2021, 10 pages".

* cited by examiner

FULLY SELF-ALIGNED SUBTRACTIVE ETCH

CROSS-REFERENCE TO RELATED APPLICATIONS

This application claims priority to U.S. Provisional Application No. 63/037,210, filed Jun. 10, 2020, the entire disclosure of which is hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure are directed to methods of producing self-aligned metallization layers and vias.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

Ruthenium has been used to replace copper as the back-end-of-line (BEOL) interconnect material for sub-5 nm technology nodes. As current node size shrinks, the interconnect resistance/capacitance (RC) delay is over one-thousand times larger than the transistor delay, so the interconnect delay dominates the total delay time. Reducing the RC delay becomes one of the biggest scaling challenges. Accordingly, methods and devices for reducing interconnect delay are needed.

SUMMARY

Apparatuses and methods to form an electronic device are described. In one or more embodiments, a method to form an electronic device comprises: forming a first metallization line, the first metallization line having a first width; forming a via mask on a via metallization layer on the first metallization line, the via mask having a mask width and a mask length; forming a via, the via having a via metal length that is equal to the mask width and having a via metal width that is equal to the first width; and forming a second metallization line.

One or more embodiments are directed to an electronic device. In one or more embodiments an electronic device comprises: a first metallization line comprising a set of first conductive lines extending along a first direction on a first insulating layer on a substrate; a second metallization line comprising a set of second conductive lines on an etch stop layer above the first metallization line, the set of second conductive lines extending along a second direction that crosses the first direction at an angle; and at least one via between the first metallization line and the second metallization line, the at least one via comprising a via metallization layer, wherein the at least one via is self-aligned along the second direction to one of the first metallization lines and the at least one via is self-aligned along the first direction to one of the second metallization lines, the second direction crossing the first direction at an angle.

In one or more embodiments, a processor-implemented method for forming fully self-aligned vias is described. In one or more embodiment, a processor-implemented method comprises: receiving data for a first configuration to control forming a first metallization line, the first metallization line having a first width; receiving data for a second configuration to control forming a via mask on the first metallization line, the via mask having a mask width and a mask length; receiving data for a third configuration to control forming a via, the via having a via metal length that is equal to the mask width and having a via metal width that is equal to the first width; and receiving data for a fourth configuration to control forming a second metallization line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
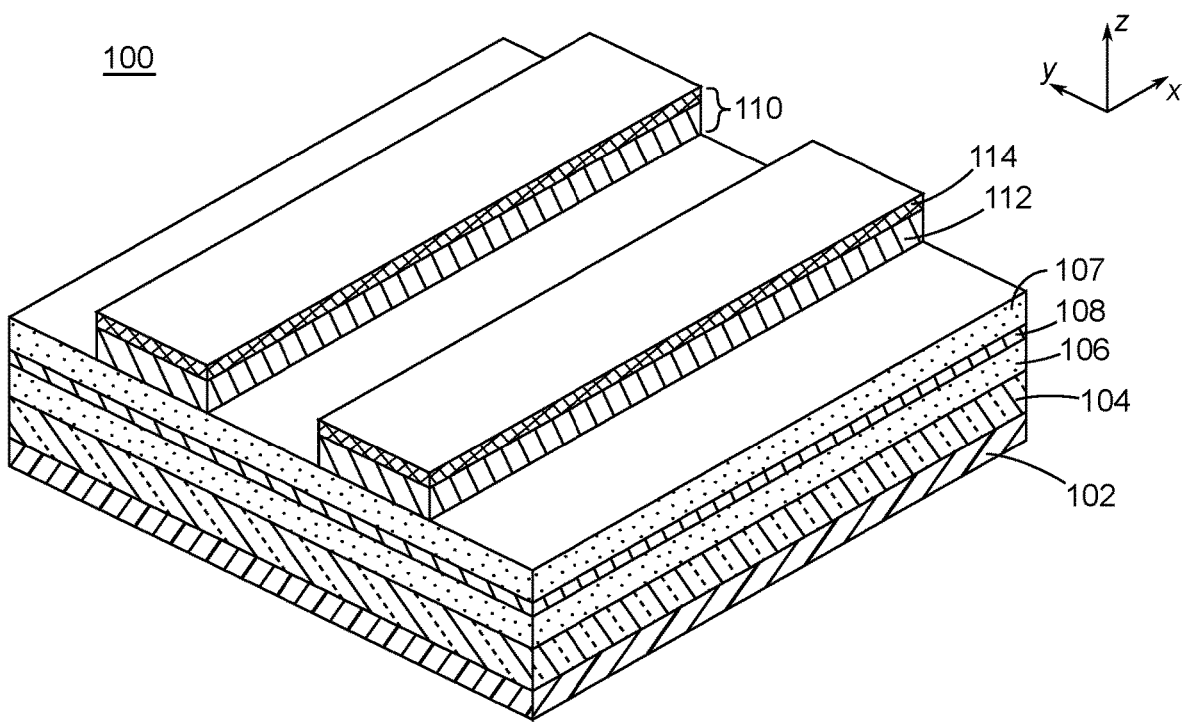
FIG. 1 illustrates a perspective view of an electronic device structure according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Apparatuses and methods to provide self-aligned metallization layers (i.e., M1 and M2) and self-aligned vias are described. In one or more embodiments, an oversized mask is used for greater overlay margin, while an additional etch step permits via critical dimension (CD) trim to match the critical dimension of the metal-line above it, creating a fully self-aligned metallization layer M1, via, and metallization layer M2. Additionally, in one or more embodiments, the final via metal area is maximized so that the via resistance is reduced.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in a least one embodiment of the present disclosure. Thus, the appearance of the phrases "In one or more embodiments" or "in an embodiment" in various places throughout the specification are not necessarily all referring to the same embodiment of the disclosure. Furthermore, the particular features, structures, or characteristics may be combined in any suitable manner in one or more embodiments.

FIG. 1 illustrates a perspective view of an electronic device 100 structure according to one or more embodiments. An insulating layer 104 on a top surface of a substrate 102 is provided. In one or more embodiments, the insulating layer may comprise any suitable material known to the skilled artisan. In a specific embodiment, the insulating layer 104 comprises silicon oxide ($SiO_x$).

In one or more embodiments, the substrate 102 comprises at least one semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In an embodiment, substrate 102 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 102 can be, e.g., an organic, a ceramic, a glass, or a semiconductor substrate. Although a few examples of materials from which the substrate 102 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, substrate 102 includes one or more metallization interconnect layers for integrated circuits. In at least some embodiments, the substrate 102 includes interconnects, for example, vias, configured to connect the metallization layers. In at least some embodiments, the substrate 102 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one or more embodiments, the substrate 102 includes one or more layers above substrate 102 to confine lattice dislocations and defects.

In one or more embodiments, insulating layer 104 can be any material suitable to insulate adjacent devices and prevent leakage. In one or more embodiments, insulating layer 104 is a flowable dielectric material. In one or more embodiments, electrically insulating layer 104 is an oxide layer, e.g., silicon dioxide, or any other electrically insulating layer determined by an electronic device design. In one or more embodiments, insulating layer 104 comprises an interlayer dielectric (ILD). In one or more embodiments, insulating layer 104 is a low-κ dielectric that includes, but is not limited to, materials such as, e.g., silicon dioxide, silicon oxide, silicon oxycarbide, carbon doped oxide ("CDO"), e.g., carbon doped silicon dioxide, porous silicon dioxide ($SiO_2$), silicon nitride (SiN), or any combination thereof.

In one or more embodiments, insulating layer 104 includes a dielectric material having a κ-value less than 5. In one or more embodiments, insulating layer 104 includes a dielectric material having a κ-value less than 2. In at least some embodiments, insulating layer 104 includes oxides, carbon doped oxides, porous silicon dioxide, carbides, oxycarbides, nitrides, oxynitrides, oxycarbonitrides, polymers, phosphosilicate glass, fluorine doped silicon dioxide, organosilicate glass (OSG), fluorosilicate (SiOF) glass, organosilicate glass (SiOCH), spin-on organic polymer dielectrics, spin-on silicon based polymeric dielectric materials, air gaps, or any combinations thereof, other electrically insulating layers determined by an electronic device design, or any combination thereof. In at least some embodiments, insulating layer 104 may include polyimide, epoxy, photo-definable materials, such as benzocyclobutene (BCB), and WPR-series materials, or spin-on-glass.

In one or more embodiments, insulating layer 104 is a low-κ interlayer dielectric to isolate one metal line from other metal lines on substrate 102. In one or more embodiments, the thickness of the insulating layer 104 is in an approximate range from about 1 nanometer (nm) to about 2 microns (μm).

In an embodiment, insulating layer 104 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one or more embodiments, a first metallization layer 106 is formed on a top surface of the insulating layer 104. In one or more embodiments, the first metallization layer 106 comprises any suitable metal known to the skilled artisan, including, but not limited to, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), or cadmium (Cd). In one or more specific embodiments, the first metallization layer 106 comprises ruthenium (Ru).

In one or more embodiments, a via metallization layer 107 is formed on a top surface of the etch stop layer 108. In one or more embodiments, the via metallization layer comprises any suitable metal known to the skilled artisan, including, but not limited to, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), or cadmium (Cd). In one or more specific embodiments, the via metallization layer 107 comprises ruthenium (Ru).

In one or more embodiments, the first metallization layer 106 and the via metallization layer 107 may be separated by an etch stop layer 108. The etch stop layer 108 may comprise any suitable material known to the skilled artisan. In one or more embodiments, the etch stop layer 108 comprises one or more of titanium nitride (TiN), titanium (Ti), tantalum (Ta), or tantalum nitride (TaN), aluminum oxide ($Al_2O_3$), titanium oxide ($TiO_2$), silicon nitride (SiN), silicon carbonitride (SiCN), tungsten carbide (WC), tungsten boron carbide (WBC), silicon boride (SiBx), boron carbide (BC), amorphous carbon, boron nitride (BN), boron carbon nitride (BCN), and the like. In one or more specific embodiments, the etch stop layer 108 comprises titanium nitride (TiN).

In one or more embodiments, a hard mask 110 is formed on the via metallization layer 107. The hard mask 110 may comprise an extreme ultraviolet (EUV) trilayer 114 and a hard mask layer 112. The EUV trilayer 114 may comprise one or more of a photoresist, spin-on-carbon, and spin-on-glass. The hard mask layer 112 may comprise any suitable material known to the skilled artisan. In one or more embodiments, the hard mask layer 112 comprises one or more of titanium nitride (TiN), titanium (Ti), tantalum (Ta), or tantalum nitride (TaN), aluminum oxide ($Al_2O_3$), titanium oxide ($TiO_2$), silicon nitride (SiN), silicon carbonitride (SiCN), tungsten carbide (WC), tungsten boron carbide (WBC), silicon boride (SiBx), boron carbide (BC), amorphous carbon, boron nitride (BN), boron carbon nitride (BCN), and the like. In one or more specific embodiments, the hard mask layer 112 comprises titanium nitride (TiN).

Figure 2:
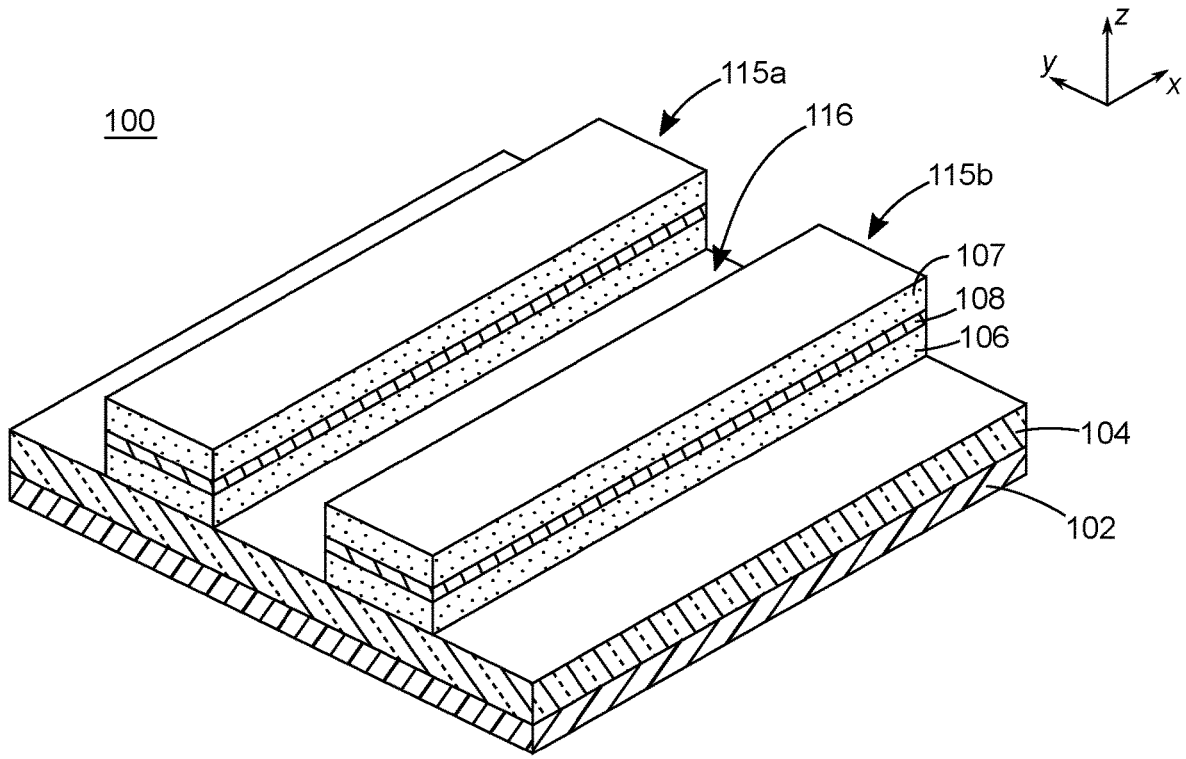
FIG. 2 illustrates a perspective view of an electronic device structure according to one or more embodiments.

FIG. 2 illustrates a perspective view of an electronic device 100 structure according to one or more embodiments. In one or more embodiments, at least one metallization line 115, M1, is patterned and is a part of a back end metallization of the electronic device 100. The first metallization line 115 extends along a first direction x. The conductive metal lines 115a/115b may be separated by a trench 116. In one or more embodiments, the first metallization layer 106 and the via metallization layer 107 are patterned and etched using a hard mask 110 to form at least one trench 116 and first metallization line 115 using one or more patterning and etching techniques known to one of ordinary skill in the art of microelectronic device manufacturing.

In one or more embodiments, the depth of the trench 116 is in a range of from about 1 nm to about 500 nm. In one or more embodiments, the depth of the trenches 116 is in a range of from about 10% to about 100% of the thickness of the conductive metal lines 115a/115b.

Figure 3:
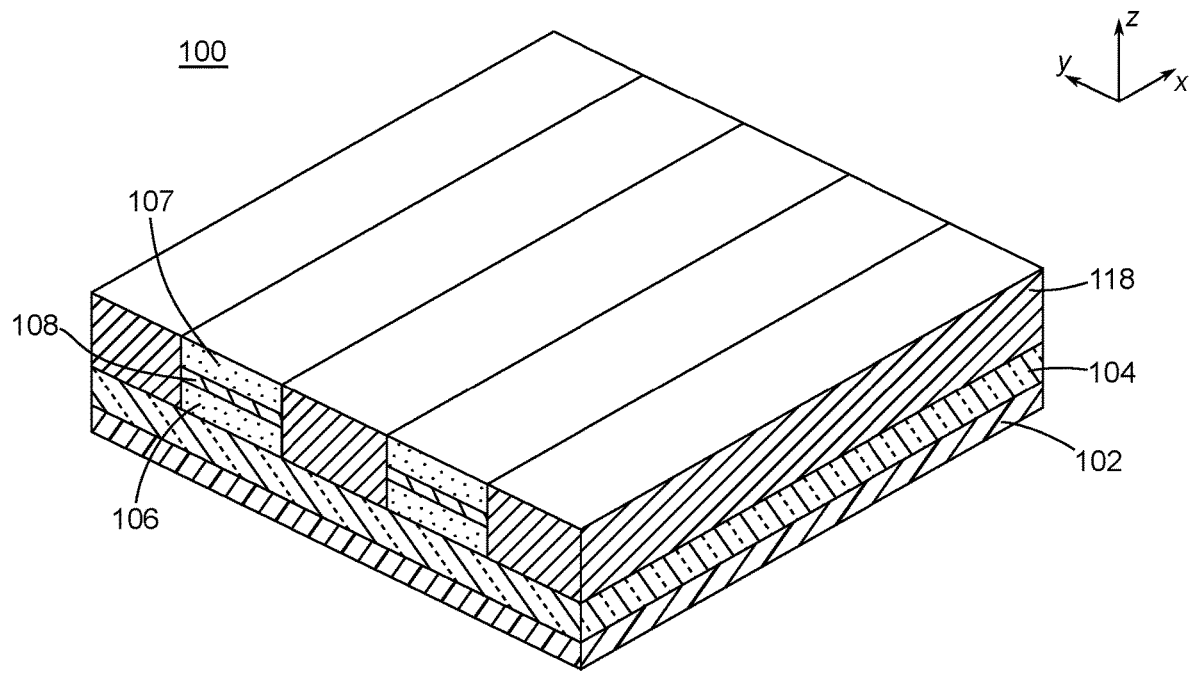
FIG. 3 illustrates a perspective view of an electronic device structure according to one or more embodiments.

FIG. 3 illustrates a perspective view of an electronic device 100 structure according to one or more embodiments. In one or more embodiments, a gapfill layer 118 is formed on the metal lines 115a/115b and in the trench 116.

In one or more embodiments, the gapfill layer 118 is deposited using one of deposition techniques, such as but not limited to an ALD, a CVD, PVD, MBE, MOCVD, spin-on or other liner deposition techniques known to one of ordinary skill in the art of microelectronic device manufacturing. In one or more embodiments, the gapfill layer 118 comprises a flowable low-k material. The flowable low-k material may comprise any suitable material known to the skilled artisan.

In one or more embodiments, gapfill layer 118 is a flowable silicon oxide (FSiOx) layer. In at least some embodiments, gapfill layer 118 is an oxide layer, e.g., silicon dioxide ($SiO_2$), or any other electrically insulating layer determined by an electronic device design. In one or more embodiments, gapfill layer 118 is an interlayer dielectric (ILD). In one or more embodiments, gapfill layer 118 is a low-κ dielectric that includes, but is not limited to, materials such as, e.g., silicon dioxide, silicon oxide, a carbon based material, e.g., a porous carbon film, carbon doped oxide ("CDO"), e.g. carbon doped silicon dioxide, porous silicon dioxide, porous silicon oxide carbide hydride (SiOCH), silicon nitride, or any combination thereof. In one or more embodiments, gapfill layer 118 is a dielectric material having κ-value less than 3. In more specific embodiment, gapfill layer 118 is a dielectric material having κ-value in an approximate range from about 2.2 to about 2.7. In one or more embodiments, gapfill layer 118 includes a dielectric material having κ-value less than 2. In one or more embodiments, gapfill layer 118 represents one of the insulating layers described above with respect to insulating layer 104.

In one or more embodiments, gapfill layer 118 is a low-κ interlayer dielectric to isolate one metal line from other metal lines. In one or more embodiments, gapfill layer 118 is deposited using one of deposition techniques, such as but not limited to a CVD, spin-on, an ALD, PVD. MBE, MOCVD, or other low-κ insulating layer deposition techniques known to one of ordinary skill in the art of microelectronic device manufacturing.

In some embodiments, the formation of the gapfill layer 118 is described as using a bulk deposition of the gapfill material to form an overburden on the top of the substrate followed by planarization to remove the overburden. In some embodiments, the gapfill layer 118 is formed by a selective deposition process that forms substantially no (e.g., <5% area) overburden on conductive metal lines 115a/115b.

Figure 4:
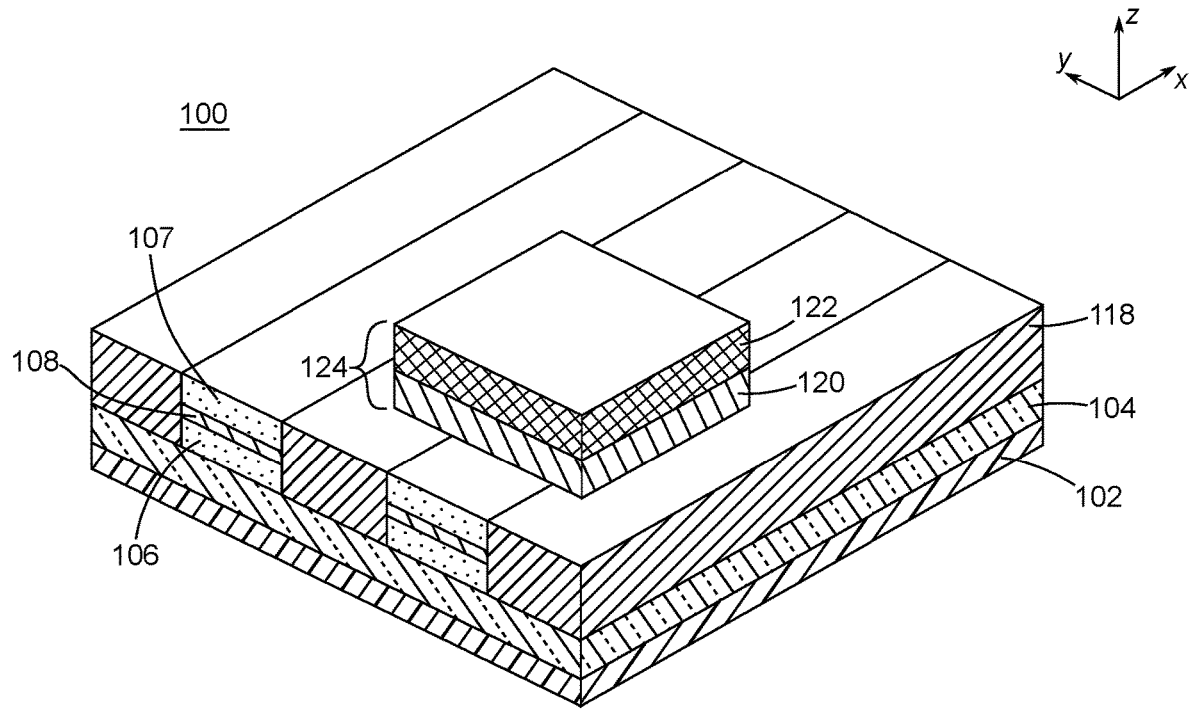
FIG. 4 illustrates a perspective view of an electronic device structure according to one or more embodiments.

FIG. 4 illustrates a perspective view of an electronic device 100 structure according to one or more embodiments. In one or more embodiments, a via hard mask 124 is formed on a top surface of the gapfill layer 118 and over a metal line 115b. In some embodiments, the via hard mask 124 comprises an extreme ultraviolet (EUV) trilayer 122 on a hard mask layer 120. In one or more embodiments, the EUV trilayer 122 comprises one or more of a photoresist, a spin-on-carbon layer, and a spin-on-glass layer. In one or more embodiments, the hard mask layer 120 may comprise any suitable material known to the skill artisan. In one or more embodiments, the hard mask layer 120 comprises one or more of titanium nitride (TiN), titanium (Ti), tantalum (Ta), or tantalum nitride (TaN), aluminum oxide ($Al_2O_3$), titanium oxide ($TiO_2$), silicon nitride (SiN), silicon carbonitride (SiCN), tungsten carbide (WC), tungsten boron carbide (WBC), silicon boride (SiBx), boron carbide (BC), amorphous carbon, boron nitride (BN), boron carbon nitride (BCN), and the like. In one or more specific embodiments, the hard mask layer 120 comprises titanium nitride (TiN).

Without intending to be bound by theory, it is thought that using an oversized via hard mask 124 permits greater overlay margin. In one or more embodiments, the via hard mask 124 has a size that is between the critical dimension (CD) of the metal line 115b and the pitch size. In one or more embodiments, the via hard mask 124 has a width, W, extending along a second direction y, and a length, L, extending along the first direction x. In one or more embodiments, the width, W, and the length, L are the same. In other embodiments, the width, W, and the length, L are different. In one or more embodiments, the via hard mask 124 has a width, W, in a range of from about 1 nm to about 100 nm, including a range of from about 5 nm to about 75 nm, a range of from about 5 nm to about 50 nm, a range of from about 5 nm to about 25 nm, and a range of from about 10 nm to about 25 nm. In one or more embodiments, the via hard mask 124 has a length, in a range of from about 1 nm to about 100 nm, including a range of from about 5 nm to about 75 nm, a range of from about 5 nm to about 50 nm, a range of from about 5 nm to about 25 nm, and a range of from about 10 nm to about 25 nm. In embodiments where the width, W, and the length, L, of the via hard mask 124 are the same, the via hard mask 124 has a square shape.

In one or more embodiments, the metal pitch size is about 22 nm, the metal line CD is about 11 nm, and the oversized via hard mask is in a range of from about 11 nm to about 22 nm. In one or more embodiments, the via hard mask 124 has a width, W, of about 19 nm and a length, L, of about 19 nm, which minimizes misalignment margin and line short risk.

In one or more embodiments, the via hard mask 124 is oversized. As used herein, the term "oversized" refers to the width, W, and the length, L of the via hard mask 124 relative to the underlying metal line 115b. In one or more embodiments, the width, W, of the via hard mask 124 is greater than the width of the metal line 115b.

Figure 5:
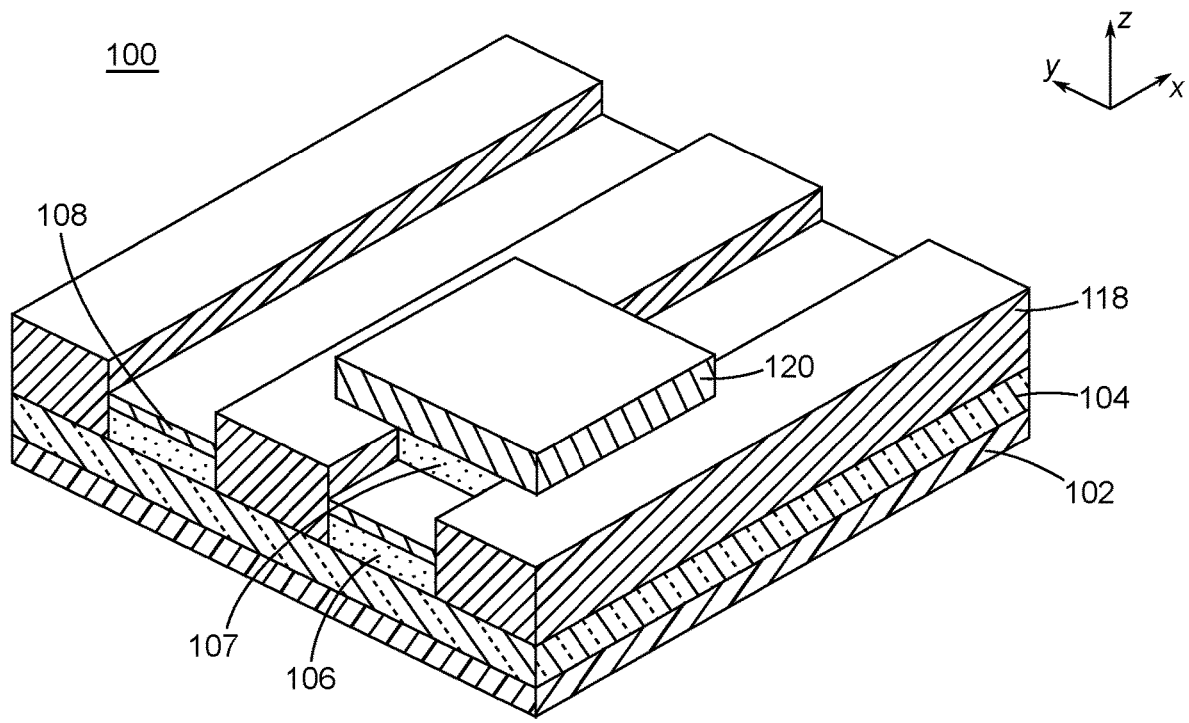
FIG. 5 illustrates a perspective view of an electronic device structure according to one or more embodiments.

FIG. 5 illustrates a perspective view of an electronic device 100 structure according to one or more embodiments.

In one or more embodiments, the via metallization layer 107 etched to expose a top surface of the etch stop layer 108 and the hard mask layer 120.

Figure 6:
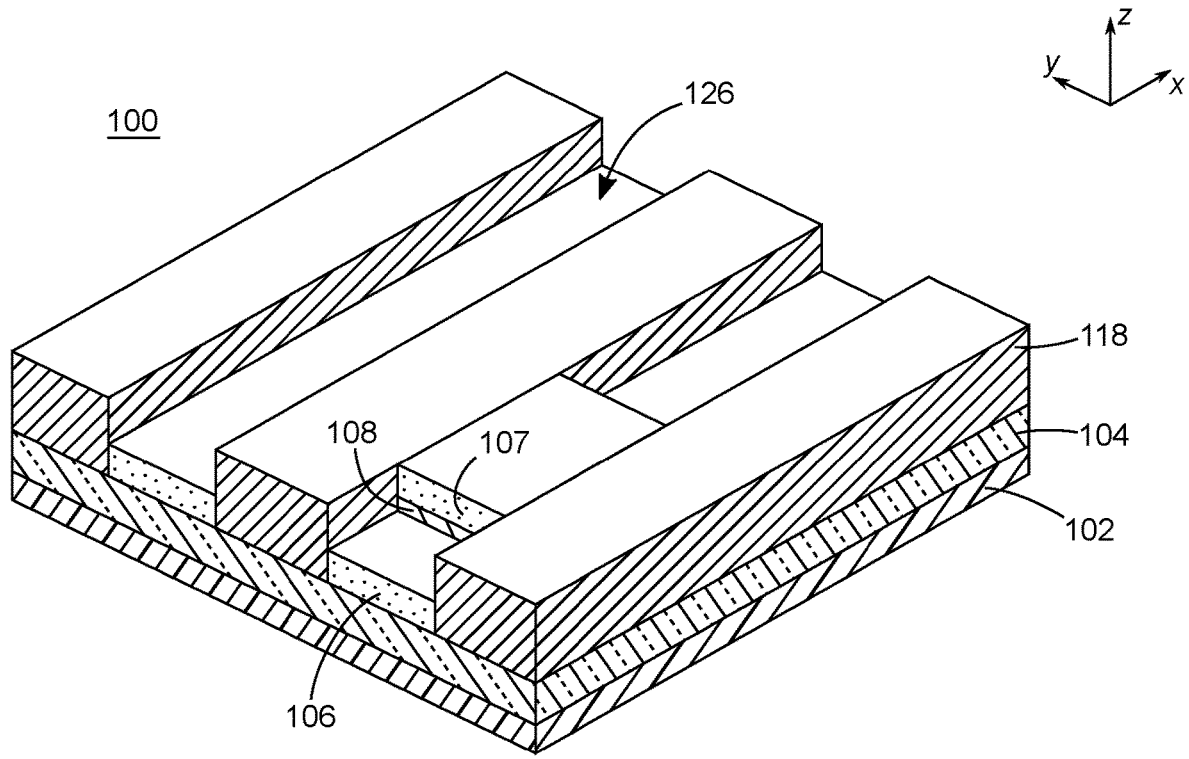
FIG. 6 illustrates a perspective view of an electronic device structure according to one or more embodiments.

FIG. 6 illustrates a perspective view of an electronic device 100 structure according to one or more embodiments. In one or more embodiments, the etch stop layer 108 and the hard mask layer 120 are removed to form openings 126. In one or more embodiments, the hard mask layer 120 may be removed by any technique known to one of skill in the art, including, but not limited to, selective dry etching.

Figure 7:
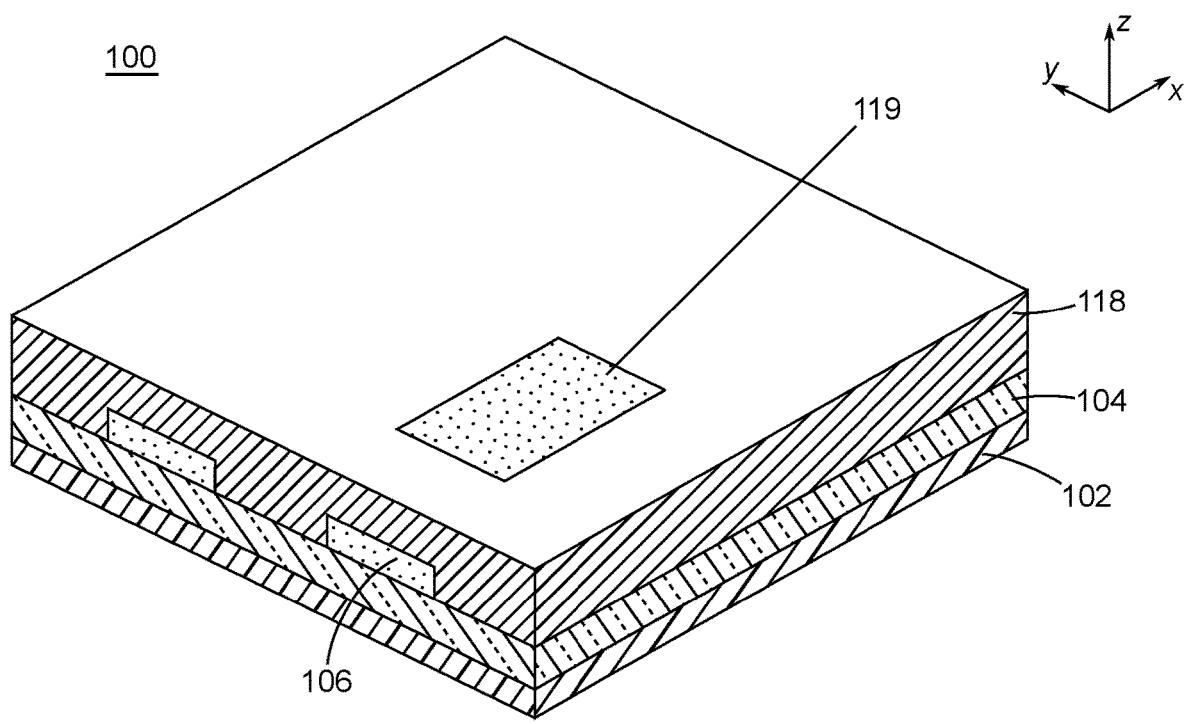
FIG. 7 illustrates a perspective view of an electronic device structure according to one or more embodiments.

FIG. 7 illustrates a perspective view of an electronic device 100 structure according to one or more embodiments. In one or more embodiments, a gapfill layer 118 is deposited to fill the openings 126.

In some embodiments, the formation of the gapfill layer 118 is described as using a bulk deposition of the gapfill material to form an overburden on the top of the substrate followed by planarization to remove the overburden. In some embodiments, the gapfill layer 118 is formed by a selective deposition process that forms substantially no (e.g., <5% area) overburden on conductive metal lines 115a/115b.

In one or more embodiments, after the gapfill layer 118 is deposited and, optionally, planarized, to reveal a via 119 in the gapfill layer 118. The via 119 comprises the via metallization layer 107.

In one or more embodiments, the via 119 has a metal length extending along the first direction, which is the same as the length of the oversized mask 124. In one or more embodiments, the via metal length is in a range of from about 1 nm to about 100 nm, including a range of from about 5 nm to about 75 nm, a range of from about 5 nm to about 50 nm, a range of from about 5 nm to about 25 nm, and a range of from about 10 nm to about 25 nm 10 nm to about 25 nm. In specific embodiments, the via metal length is about 19 nm. In one or more embodiments, the via metal width is the same as metal line 115a (M1) width, due to the double metal etching at the same time. In one or more embodiments, the shape, e.g. rectangular, of the via metal could allow some margin for M2 mask misalignment/displacement error.

In one or more embodiments, after the second lithography, the rectangular shaped via metal is created by subtractive etch. In one or more embodiments, the rectangular shaped via, rather than a square shaped via, provides bigger edge placement error (EPE) error margin for the third lithography, M2 alignment. After the second metallization line is formed, part of the rectangular shaped via metal where just underneath the second metallization lien will be kept from etching than forming a square shape via metal. The extra via metal, the volume of the rectangular shape metal minus square shape metal, will be etched away to form two trenches and later will be filled with low-k gap fill material.

Figure 8:
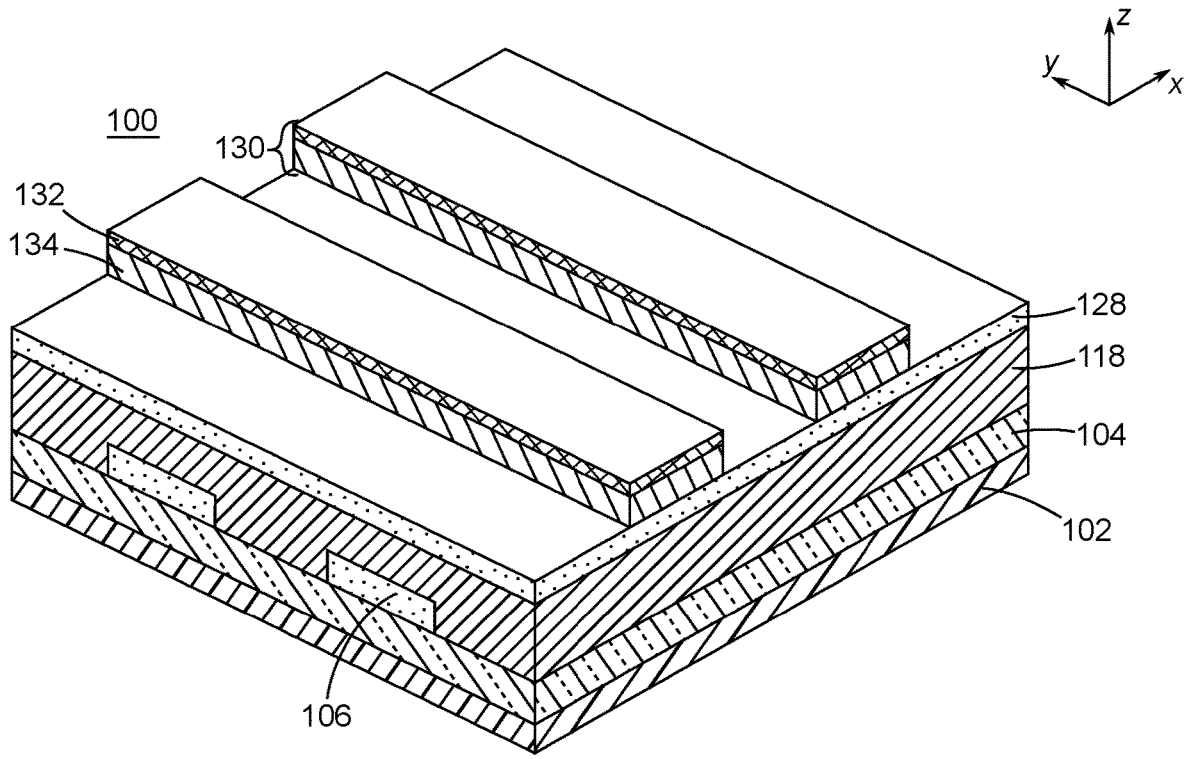
FIG. 8 illustrates a perspective view of an electronic device structure according to one or more embodiments.

FIG. 8 illustrates a perspective view of an electronic device 100 structure according to one or more embodiments. In one or more embodiments, a second metallization layer 128 is formed on a top surface of the gapfill layer 118. In one or more embodiments, second metallization layer 128 is deposited using one of deposition techniques, such as but not limited to a CVD, spin-on, an ALD, PVD, MBE, MOCVD, or other deposition techniques known to one of ordinary skill in the art of microelectronic device manufacturing.

In one or more embodiments, second metallization layer 128 can comprise any suitable metal known to the skill artisan. In one or more embodiment, second metallization layer 128 comprises copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), or cadmium (Cd). In specific embodiments, the second metallization layer 128 comprises ruthenium (Ru).

In one or more embodiments, a hard mask 130 is formed on second metallization layer 128. In one or more embodiments, the hard mask 130 comprises an extreme ultraviolet (EUV) trilayer 132 on a hard mask layer 134. The hard mask layer 134 may comprise any suitable material known to the skilled artisan. In one or more embodiments, the hard mask layer 134 comprises one or more of titanium nitride (TiN), titanium (Ti), tantalum (Ta), or tantalum nitride (TaN), aluminum oxide ($Al_2O_3$), titanium oxide ($TiO_2$), silicon nitride (SiN), silicon carbonitride (SiCN), tungsten carbide (WC), tungsten boron carbide (WBC), silicon boride ($SiB_x$), boron carbide (BC), amorphous carbon, boron nitride (BN), boron carbon nitride (BCN), and the like. In one or more specific embodiments, the hard mask layer 134 comprises titanium nitride (TiN).

Figure 9:
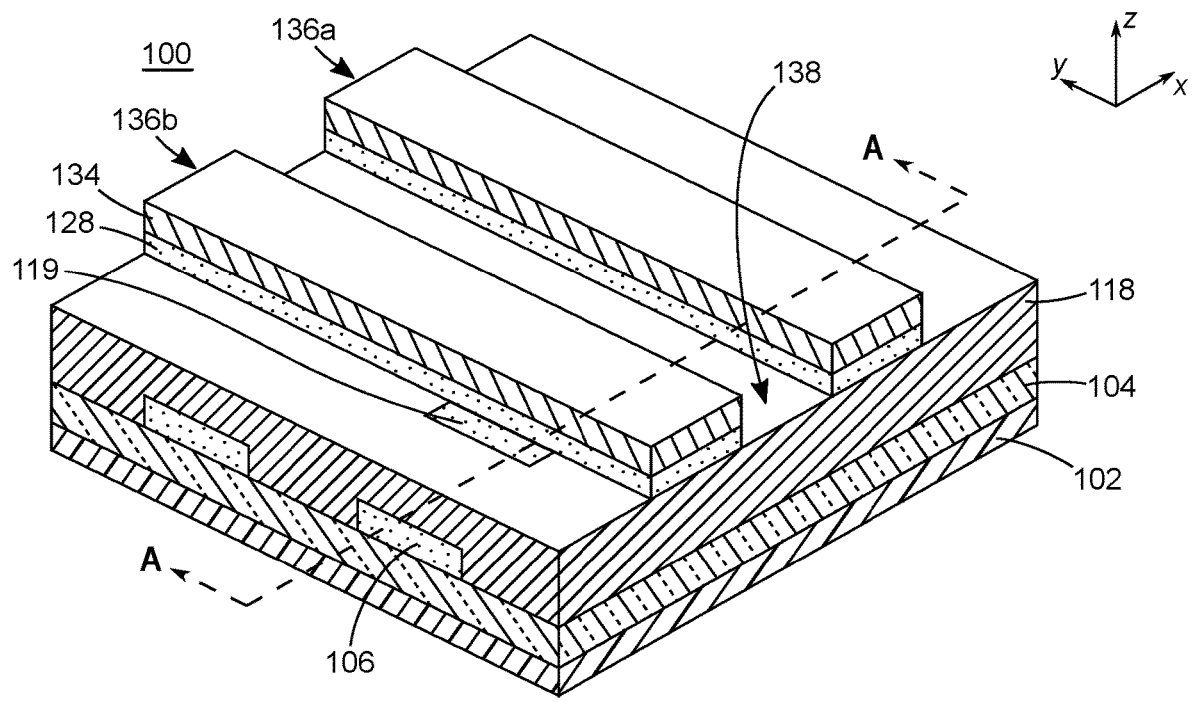
FIG. 9 illustrates a perspective view of an electronic device structure according to one or more embodiments.
Figure 9A:
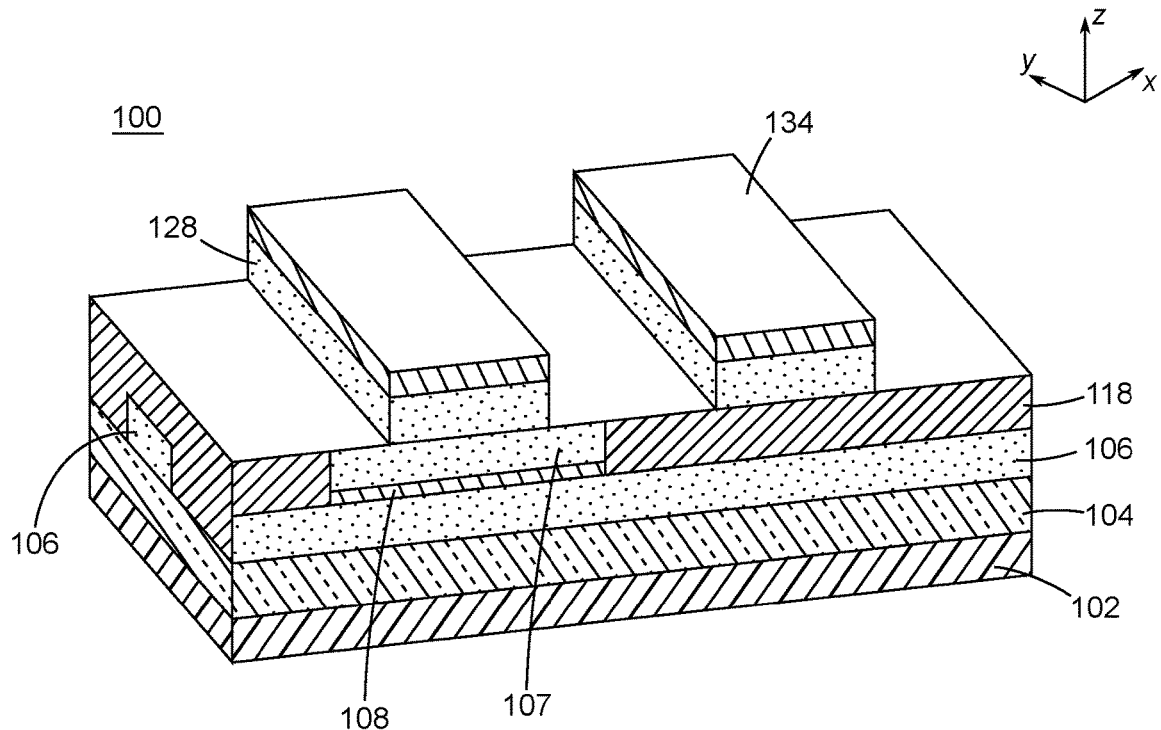
FIG. 9A illustrates a perspective view of an electronic device structure according to one or more embodiments.

FIG. 9 illustrates a perspective view of an electronic device 100 structure according to one or more embodiments. FIG. 9A illustrates a cross-section view of the electronic device 100 taken along axis A of FIG. 9 according to one or more embodiments. In one or more embodiments, at least one second metallization line 136, M2, is patterned and is a part of a back end metallization of the electronic device 100, the second metallization line 136 extending along a second direction y. The conductive metal lines 136a/136b may be separated by a trench 138. In one or more embodiments, the second metallization layer 128 is patterned and etched using a hard mask 130 to form trenches 138 and second metallization line 136 using one or more patterning and etching techniques known to one of ordinary skill in the art of microelectronic device manufacturing. In one or more embodiments, the device is etched to expose a top surface of gapfill layer 118, a top surface of etch stop layer 134, and forming trenches 138. In other words, in one or more embodiments second metallization layer 128 and the hard mask layer 143 are etched to expose a top surface of gapfill layer 118 and a rectangular shaped via 119.

Figure 10:
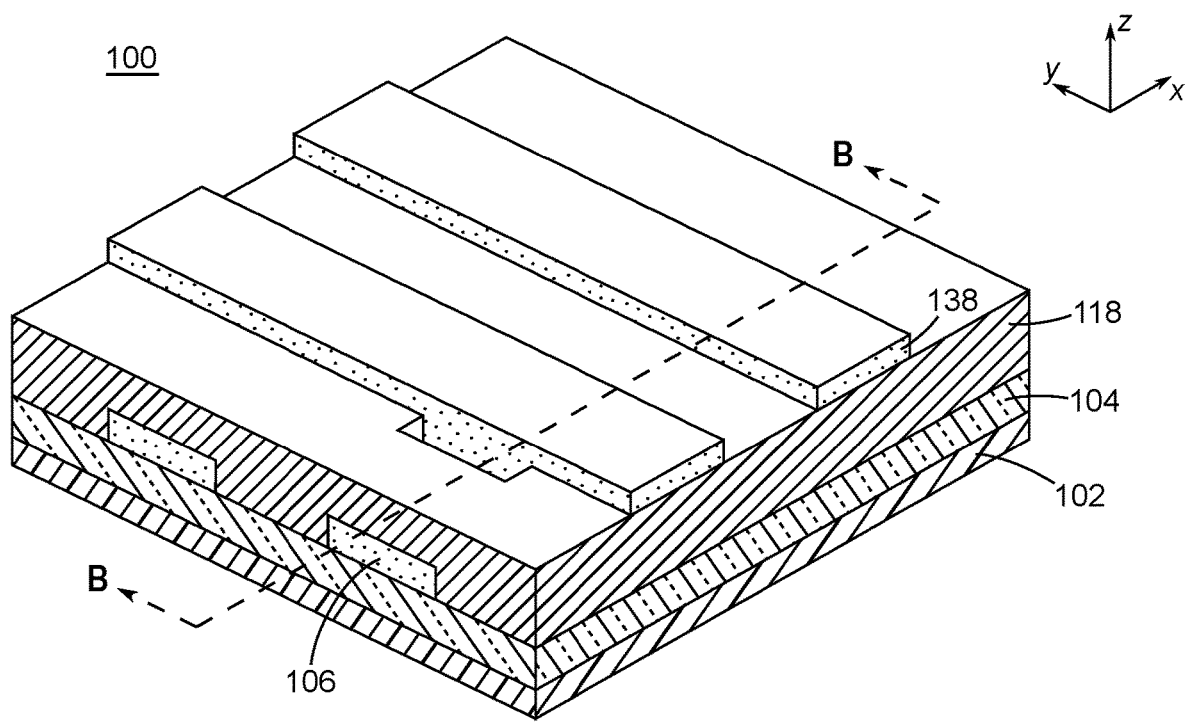
FIG. 10 illustrates a perspective view of an electronic device structure according to one or more embodiments.
Figure 10A:
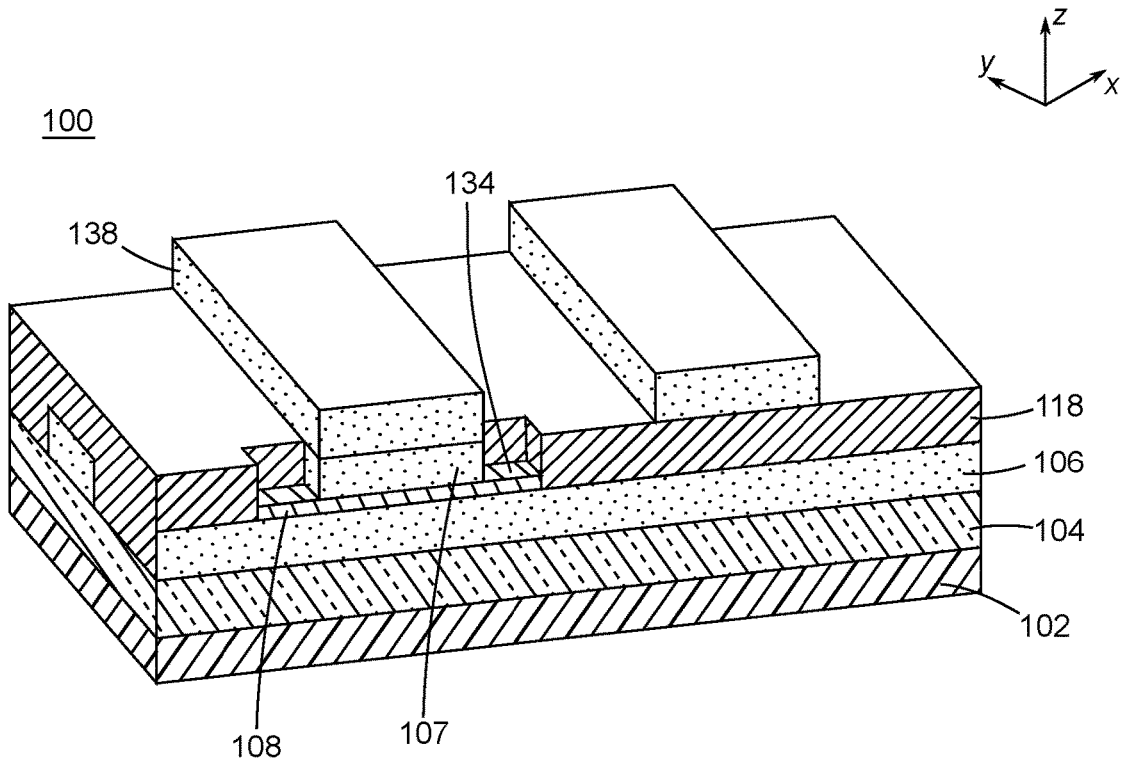
FIG. 10A illustrates a perspective view of an electronic device structure according to one or more embodiments.

FIG. 10 illustrates a perspective view of an electronic device 100 structure according to one or more embodiments. FIG. 10A illustrates a cross-section view of the electronic device 100 taken along axis B of FIG. 10 according to one or more embodiments. In one or more embodiments, the excess second metallization layer 128 in the trench 138 is etched and the hard mask layer 134 is removed. In one or more embodiments, this process may be referred to as via trimming.

In one or more embodiments, via trimming occurs by dry etching the excessive via metal in the trench.

Figure 11:
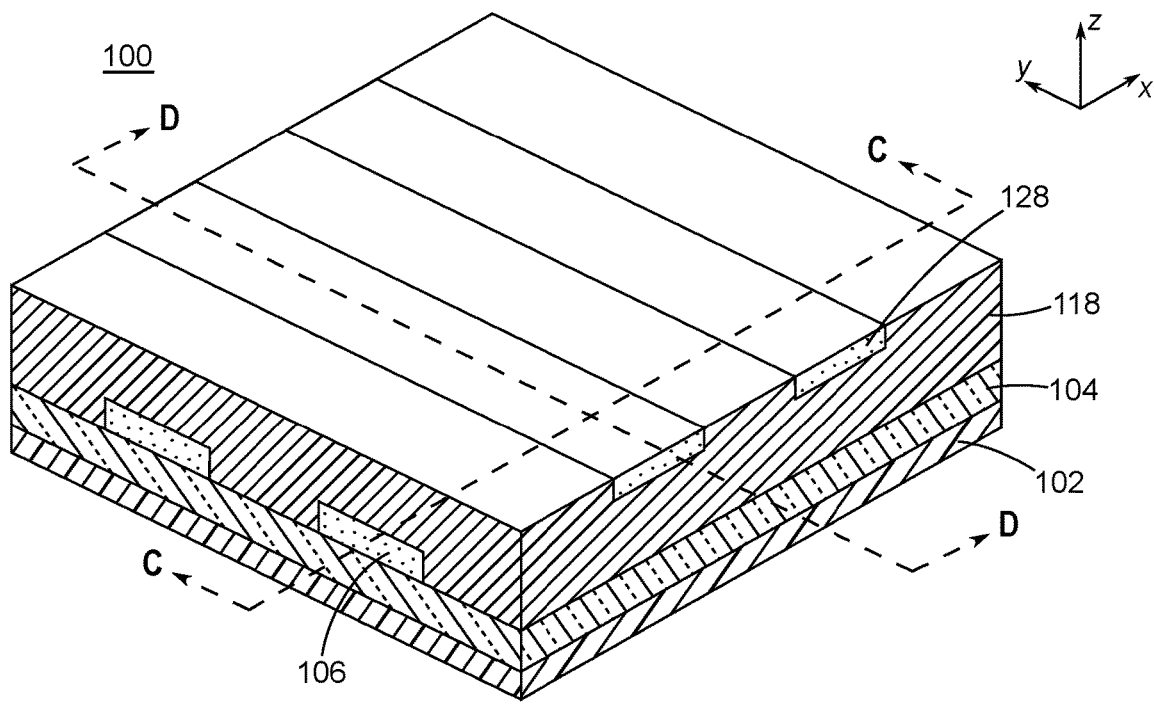
FIG. 11 illustrates a perspective view of an electronic device structure according to one or more embodiments.
Figure 11A:
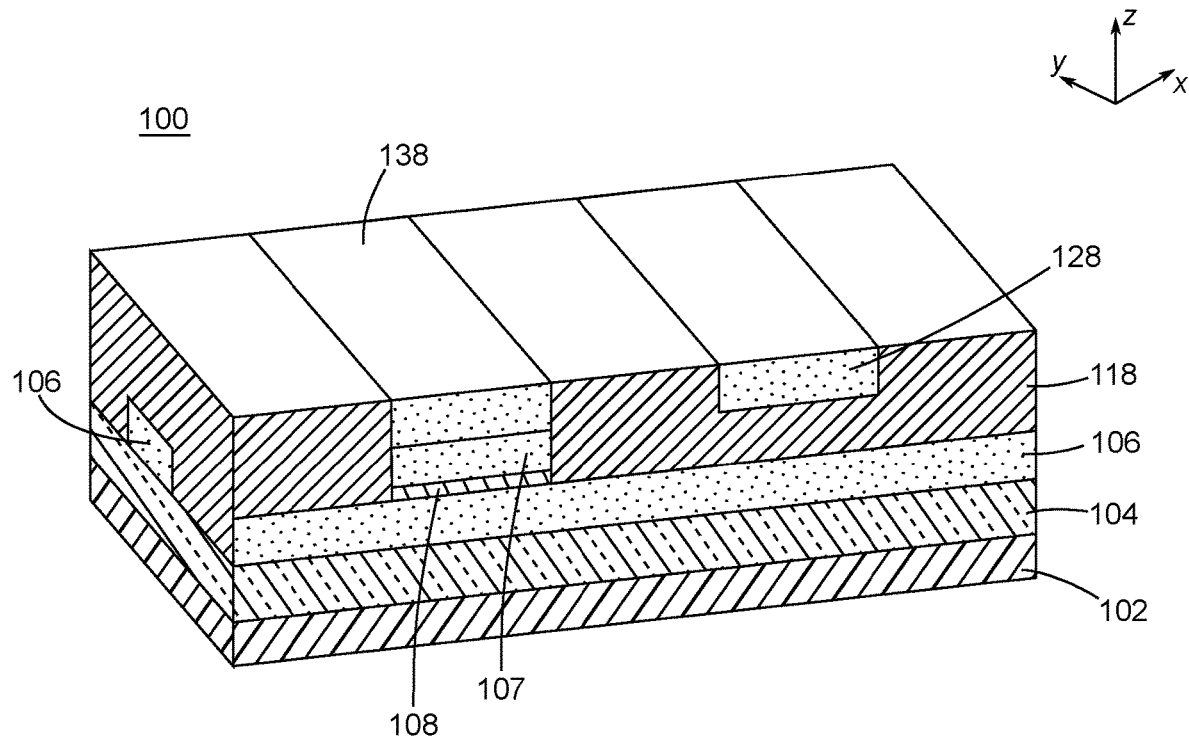
FIG. 11A illustrates a perspective view of an electronic device structure according to one or more embodiments.
Figure 11B:
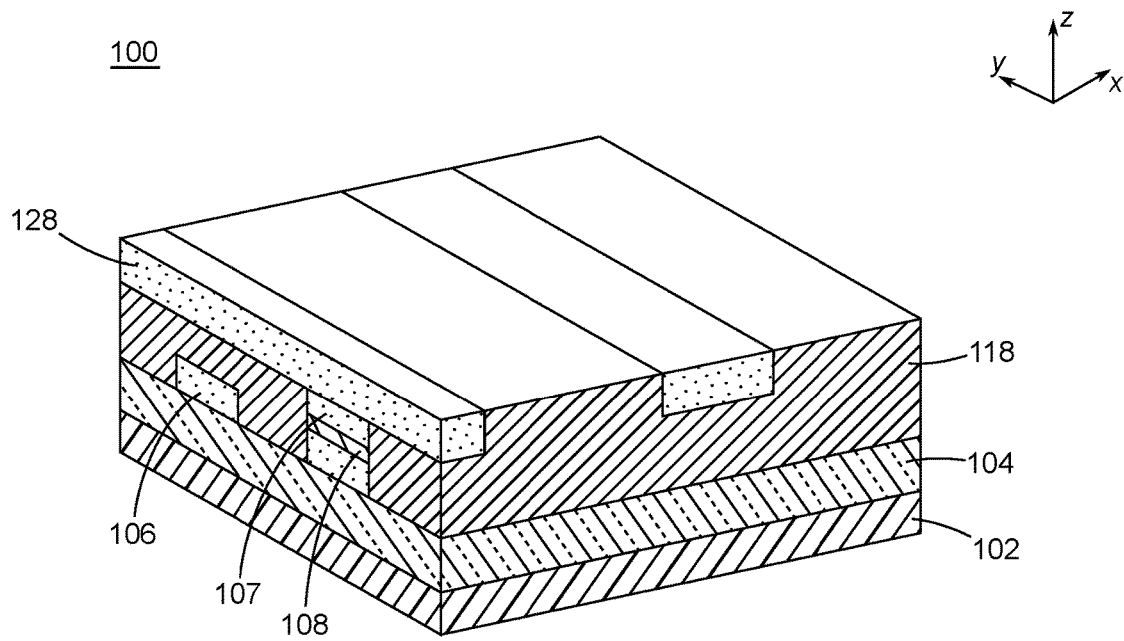
FIG. 11B illustrates a perspective view of an electronic device structure according to one or more embodiments.

FIG. 11 illustrates a perspective view of an electronic device 100 structure according to one or more embodiments. FIG. 11A illustrates a cross-section view of the electronic device 100 taken along axis C of FIG. 11 according to one or more embodiments. FIG. 11B illustrates a cross-sectional view of the electronic device 100 taken along axis D of FIG. 11 according to one or more embodiments. In one or more embodiments, a gapfill layer 118 is formed on the top surface of the second metallization layer 128.

In some embodiments, the formation of the gapfill layer 118 is described as using a bulk deposition of the gapfill material to form an overburden on the top of the substrate followed by planarization to remove the overburden. In some embodiments, the gapfill layer 118 is formed by a selective deposition process that forms substantially no (e.g., <5% area) overburden on conductive metal lines 136a/136b.

Figure 12:
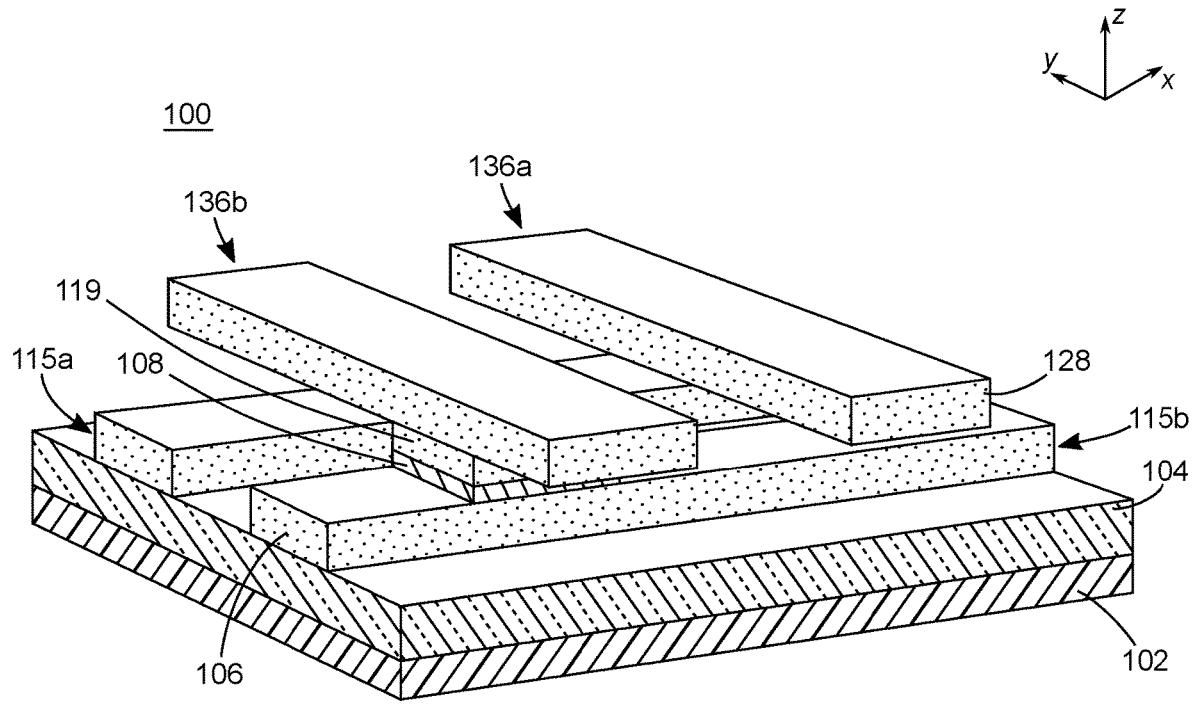
FIG. 12 illustrates a perspective view of an electronic device structure according to one or more embodiments.

FIG. 12 illustrates a perspective view of an electronic device 100 structure according to one or more embodiments. Referring to FIG. 12, the gapfill layer 118 has been removed for the purposes of making the structure of the device more readily visible. The device comprises an insulating layer 104 on substrate 102 and first metallization lines 115a/115b fully self-aligned with second metallization lines 136a/136b. The first metallization lines 115a/115b extend along the first direction x, and the second metallization lines 136a/136b extend along the second direction y. In some embodiments, an etch stop layer 108 separates the first metallization lines 115a/15b and the second metallization lines 136a/136b.

In one or more embodiments, insulating layer 104 can be any material suitable to insulate adjacent devices and prevent leakage. In one or more embodiments, insulating layer 104 is a flowable dielectric material. In one or more embodiments, electrically insulating layer 104 is an oxide layer, e.g., silicon dioxide, or any other electrically insulating layer determined by an electronic device design. In one or more embodiments, insulating layer 104 comprises an interlayer dielectric (ILD). In one or more embodiments, insulating layer 104 is a low-κ dielectric that includes, but is not limited to, materials such as, e.g., silicon dioxide, silicon oxide, silicon oxycarbide, carbon doped oxide ("CDO"), e.g., carbon doped silicon dioxide, porous silicon dioxide ($SiO_2$), silicon nitride (SiN), or any combination thereof.

In one or more embodiments, insulating layer 104 includes a dielectric material having a κ-value less than 5. In one or more embodiments, insulating layer 104 includes a dielectric material having a κ-value less than 2. In at least some embodiments, insulating layer 104 includes oxides, carbon doped oxides, porous silicon dioxide, carbides, oxycarbides, nitrides, oxynitrides, oxycarbonitrides, polymers, phosphosilicate glass, fluorine doped silicon dioxide, organosilicate glass (OSG), fluorosilicate (SiOF) glass, organosilicate glass (SiOCH), spin-on organic polymer dielectrics, spin-on silicon based polymeric dielectric materials, air gaps, or any combinations thereof, other electrically insulating layers determined by an electronic device design, or any combination thereof. In at least some embodiments, insulating layer 104 may include polyimide, epoxy, photodefinable materials, such as benzocyclobutene (BCB), and WPR-series materials, or spin-on-glass.

In one or more embodiments, insulating layer 104 is a low-κ interlayer dielectric to isolate one metal line from other metal lines on substrate 102. In one or more embodiments, the thickness of the insulating layer 104 is in an approximate range from about 1 nanometer (nm) to about 2 microns (μm).

In an embodiment, insulating layer 104 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one or more embodiments, the first metallization lines 115a and 115b comprise a first metallization layer 106. In one or more embodiments, the first metal layer 106a comprises any suitable metal known to the skill artisan, including, but not limited to, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), or cadmium (Cd). In one or more specific embodiments, the first metallization layer 106 comprises ruthenium (Ru).

In one or more embodiments, the first metallization lines 115a/115b comprise a metal selected from one or more of copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), or cadmium (Cd). In specific embodiments, the first metallization lines 115a/115b comprise ruthenium (Ru).

In one or more embodiments, the second metallization lines 136a/136b comprise a metal selected from one or more of copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), or cadmium (Cd). In specific embodiments, the first metallization lines 136a/136b comprise ruthenium (Ru).

Referring to FIG. 12, one or more embodiments provide an electronic device 100 comprising a first metallization line 115 comprising a set of first conductive lines extending along a first direction x on a first insulating layer 104 on a substrate 102; a second metallization layer 136 comprising a set of second conductive lines on an etch stop layer 108 above the first metallization line 115, the set of second conductive lines extending along a second direction y that crosses the first direction at an angle; and at least one via 119 between the first metallization line 115 and the second metallization line 136, the at least one via comprising a via metallization layer 107, wherein the at least one via 119 is self-aligned along the second direction to one of the first metallization lines 115 and the at least one via is self-aligned along the first direction to one of the second metallization lines 136, the second direction crossing the first direction at an angle.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming an electronic device, the method comprising:
   forming a first metallization line, the first metallization line having a first width;
   forming an oversized via mask on a via metallization layer on the first metallization line, the oversized via mask having a mask width and a mask length, the via mask comprising an extreme ultraviolet (EUV) trilayer on a hard mask layer and the mask width greater than the first width of the first metallization line;
   forming a via, the via having a via metal length that is equal to the mask width and having a via metal width that is equal to the first width; and
   forming a second metallization line.

2. The method of claim 1, wherein forming the first metallization line comprises patterning the via metallization layer on a first metallization layer on an insulating layer on a substrate, the via metallization layer having a hard mask on a top surface.

3. The method of claim 2, further comprising depositing a gapfill layer on the first metallization line.

4. The method of claim 3, wherein the oversized via mask is formed on a top surface of the via metallization layer and on a top surface of the gapfill layer.

5. The method of claim 4, wherein the via metallization layer and the first metallization layer are separated by an etch stop layer, and wherein the via metallization layer and the first metallization layer independently comprise one or more of copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), or cadmium (Cd).

6. The method of claim 5, wherein forming the via comprises:
   etching the EUV trilayer to expose a top surface of the hard mask layer;
   etching the hard mask layer to expose the via metallization layer;
   etching the via metallization layer to expose the etch stop layer; and
   removing the etch stop layer to expose a top surface of the first metallization layer.

7. The method of claim 6, wherein the etch stop layer and the hard mask layer independently comprise one or more of titanium nitride (TiN), titanium (Ti), tantalum (Ta), or tantalum nitride (TaN), aluminum oxide ($Al_2O_3$), titanium oxide ($TiO_2$), silicon nitride (SiN), silicon carbonitride (SiCN), tungsten carbide (WC), tungsten boron carbide (WBC), silicon boride (SiBx), boron carbide (BC), amorphous carbon, boron nitride (BN), boron carbon nitride (BCN), and the like.

8. The method of claim 2, wherein the insulating layer comprises one or more oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof.

9. A processor-implemented method for forming fully self-aligned vias, the method comprising:
   receiving data for a first configuration to control forming a first metallization line, the first metallization line having a first width;
   receiving data for a second configuration to control forming an oversized via mask on a via metallization layer on the first metallization line, the oversized via mask comprising an extreme ultraviolet (EUV) trilayer on a hard mask layer, the via mask having a mask width and a mask length and the mask width greater than the first width of the first metallization line;
   receiving data for a third configuration to control forming a via, the via having a via metal length that is equal to the mask width and having a via metal width that is equal to the first width; and
   receiving data for a fourth configuration to control forming a second metallization line.

10. The processor-implemented method of claim 9, wherein forming the first metallization line comprises patterning a via metallization layer on a first metallization layer on an insulating layer on a substrate, the via metallization layer having a hard mask on a top surface, and the insulating layer comprising one or more of oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof.

11. The processor-implemented method of claim 10, further comprising receiving data for a fifth configuration to control depositing a gapfill layer on the first metallization line.

12. The processor-implemented method of claim 11, wherein the oversized via mask is formed on the first metallization line and on the gapfill layer.

13. The processor-implemented method of claim 12, wherein the via metallization layer and the first metallization layer are separated by an etch stop layer, the etch stop layer and the hard mask layer independently comprising one or more of titanium nitride (TiN), titanium (Ti), tantalum (Ta), or tantalum nitride (TaN), aluminum oxide ($Al_2O_3$), titanium oxide ($TiO_2$), silicon nitride (SiN), or silicon carbonitride (SiCN), and wherein the via metallization layer and the first metallization layer independently comprise one or more of copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), or cadmium (Cd).

14. The processor-implemented method of claim 13, wherein forming the via comprises:
   etching the EUV trilayer to expose a top surface of the hard mask layer;
   etching the hard mask layer to expose the via metallization layer;
   etching the via metallization layer to expose the etch stop layer; and
   removing the etch stop layer to expose a top surface of the first metallization layer.

* * * * *